United States Patent
Jing

(10) Patent No.: US 12,429,738 B2
(45) Date of Patent: Sep. 30, 2025

(54) DISPLAY PANEL

(71) Applicant: Shenzhen China Star Optoelectronics Semiconductor Display Technology Co., Ltd., Guangdong (CN)

(72) Inventor: Xiaohong Jing, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/417,861

(22) PCT Filed: May 26, 2021

(86) PCT No.: PCT/CN2021/095926
§ 371 (c)(1),
(2) Date: Nov. 17, 2022

(87) PCT Pub. No.: WO2022/236873
PCT Pub. Date: Nov. 17, 2022

(65) Prior Publication Data
US 2024/0016036 A1    Jan. 11, 2024

(30) Foreign Application Priority Data

May 11, 2021   (CN) .......................... 202110508364.0

(51) Int. Cl.
| | | |
|---|---|---|
| G02F 1/1345 | (2006.01) | |
| G02F 1/1333 | (2006.01) | |
| G02F 1/1335 | (2006.01) | |
| H10K 59/131 | (2023.01) | |
| H10K 59/80 | (2023.01) | |
| H10K 77/10 | (2023.01) | |

(52) U.S. Cl.
CPC .... *G02F 1/13452* (2013.01); *G02F 1/133305* (2013.01); *G02F 1/133514* (2013.01); *G02F 1/1345* (2013.01); *G02F 1/13458* (2013.01); *H10K 59/131* (2023.02); *H10K 59/8722* (2023.02); *H10K 77/111* (2023.02)

(58) Field of Classification Search
None
See application file for complete search history.

(56) References Cited

U.S. PATENT DOCUMENTS

| | | |
|---|---|---|
| 2018/0182829 A1 | 6/2018 | Shin |
| 2019/0011746 A1* | 1/2019 | Que .................... G02F 1/13452 |

FOREIGN PATENT DOCUMENTS

| | | |
|---|---|---|
| CN | 107179642 | 9/2017 |
| CN | 107422553 | 12/2017 |
| CN | 107589579 | 1/2018 |
| CN | 108153070 | 6/2018 |

(Continued)

*Primary Examiner* — Dung T Nguyen

(57) ABSTRACT

An embodiment of the present application discloses a display panel. In the display panel, a first substrate includes a first bonding portion. The first bonding portion corresponds to a non-display region. A second substrate is located on a light exiting side of the display panel, and the second substrate includes a second bonding portion. The second bonding portion covers the first bonding portion. An end of the second bonding portion is bonded and connected to the first bonding portion. A flexible circuit substrate is bonded and connected to another end of the second bonding portion.

11 Claims, 3 Drawing Sheets

(56) References Cited

FOREIGN PATENT DOCUMENTS

| | | |
|---|---|---|
| CN | 108957878 | 12/2018 |
| CN | 111192883 | 5/2020 |
| KR | 10-2017-0125187 | 11/2017 |

* cited by examiner

DISPLAY PANEL

RELATED APPLICATIONS

This application is a National Phase of PCT Patent Application No. PCT/CN2021/095926 having International filing date of May 26, 2021, which claims the benefit of priority of Chinese Patent Application No. 202110508364.0 filed on May 11, 2021. The contents of the above applications are all incorporated by reference as if fully set forth herein in their entirety.

FIELD AND BACKGROUND OF THE INVENTION

The present application relates to a field of display technologies, especially to a display panel.

An inventor of the present application has discovered that a conventional display panel, for example an organic light emitting diode display panel, comprises a bonding region. Because the bonding region is exposed, when a whole machine is assembled, a frame is needed to cover the bonding region such that a full screen cannot be realized.

SUMMARY OF THE INVENTION

Technical Issue

The embodiment of the present application provides a display panel, employing a second bonding portion of a second substrate disposed on a light exiting side to cover a first bonding portion of a first substrate such that during later fabrication processes, a frame for covering a bonding region of the first substrate can be saved to further achieve a full screen.

Technical Solution

An embodiment of the present application provides a display panel comprising a display region and a non-display region disposed on a side of the display region, wherein the display panel comprises:
 a first substrate, wherein the first substrate comprises a first bonding portion, and the first bonding portion corresponds to the non-display region;
 a second substrate, wherein the second substrate and the first substrate are disposed opposite to each other, the second substrate is located on a light exiting side of the display panel, the second substrate comprises a second bonding portion, the second bonding portion covers the first bonding portion, an end of the second bonding portion is bonded and connected to the first bonding portion; and
 a flexible circuit substrate, wherein the flexible circuit substrate is bonded and connected to another end of the second bonding portion, and the flexible circuit substrate is a chip on film or a flexible circuit board;
 wherein the first bonding portion comprises a first underlay and a plurality of first conductive pads, and the first conductive pads are disposed on the first underlay;
 wherein the second bonding portion comprises a second underlay and a second conductive pad, the second conductive pad is disposed on a side of the second underlay near the first substrate, the second conductive pad and the first conductive pads are disposed opposite to each other, the second conductive pad is bonded and connected to the first conductive pads.

In some embodiments of the present application, the second bonding portion comprises a third conductive pad, the third conductive pad is disposed on the second underlay, the second conductive pad is electrically connected to the third conductive pad; and
 the flexible circuit substrate comprises a first portion including a fourth conductive pad, the fourth conductive pad is bonded and connected to the third conductive pad, and a portion of the flexible circuit substrate away from the fourth conductive pad is disposed on a side of the first substrate away from the second substrate.

In some embodiments of the present application, a first length is defined from an end of the first substrate on the first bonding portion to an end of the first substrate away from the first bonding portion; a second length is defined from an end of the second substrate on the second bonding portion to an end of the second substrate away from the second bonding portion; and the first length is less than the second length.

In some embodiments of the present application, the third conductive pad is disposed on the side of the second underlay near the first substrate.

In some embodiments of the present application, the flexible circuit substrate comprises a second portion connected to the first portion and a third portion connected to the second portion; and along a vertical direction, the second portion is located on an outside of the second substrate, and the third portion is disposed on the side of the first substrate away from the second substrate.

In some embodiments of the present application, the second substrate covers the flexible circuit substrate.

In some embodiments of the present application, the third conductive pad is disposed on a side surface of the second underlay.

The embodiment of the present application also provides a display panel comprising a display region and a non-display region disposed on a side of the display region, wherein the display panel comprises:
 a first substrate, wherein the first substrate comprises a first bonding portion, and the first bonding portion corresponds to the non-display region;
 a second substrate, wherein the second substrate and the first substrate are disposed opposite to each other, the second substrate is located on a light exiting side of the display panel, the second substrate comprises a second bonding portion, the second bonding portion covers the first bonding portion, an end of the second bonding portion is bonded and connected to the first bonding portion; and
 a flexible circuit substrate, wherein the flexible circuit substrate is bonded and connected to another end of the second bonding portion.

In some embodiments of the present application, the first bonding portion comprises a first underlay and a plurality of first conductive pads, and the first conductive pads are disposed on the first underlay;
 the second bonding portion comprises a second underlay, a second conductive pad, and a third conductive pad, the second conductive pad is disposed on a side of the second underlay near the first substrate, the third conductive pad is disposed on the second underlay, the second conductive pad is electrically connected to the third conductive pad, the second conductive pad is disposed opposite to the first conductive pads, and the second conductive pad is bonded and connected to the first conductive pads; and the flexible circuit substrate comprises a first portion including a fourth conductive pad, the fourth conductive pad is bonded and connected to the third conductive pad, and a portion of the flexible circuit substrate away from the fourth conductive pad is disposed on a side of the first substrate away from the second substrate.

In some embodiments of the present application, a first length is defined from an end of the first substrate on the first bonding portion to an end of the first substrate away from the first bonding portion; a second length is defined from an end of the second substrate on the second bonding portion to an end of the second substrate away from the second bonding portion; and the first length is less than the second length.

In some embodiments of the present application, the third conductive pad is disposed on the side of the second underlay near the first substrate.

In some embodiments of the present application, the flexible circuit substrate comprises a second portion connected to the first portion and a third portion connected to the second portion; and along a vertical direction, the second portion is located on an outside of the second substrate, and the third portion is disposed on the side of the first substrate away from the second substrate.

In some embodiments of the present application, the second substrate covers the flexible circuit substrate.

In some embodiments of the present application, the flexible circuit substrate comprises a second portion connected to the first portion and a third portion connected to the second portion, the second portion is located on a side of the first substrate, an orthographic projection of the second portion on a plane on which the second substrate is located is located in the second substrate, and the third portion is disposed on the side of the first substrate away from the second substrate.

In some embodiments of the present application, the display panel comprises a printed circuit board, the printed circuit board is bonded and connected to the third portion, and the printed circuit board is disposed on the side of the first substrate away from the second substrate.

In some embodiments of the present application, the third conductive pad is disposed on a side surface of the second underlay.

In some embodiments of the present application, each second conductive pad is electrically connected to the third conductive pad correspondingly, and the second conductive pad and the third conductive pad are formed integrally.

In some embodiments of the present application, the display panel further comprises an encapsulation adhesive, the first substrate further comprises a light emitting device layer disposed on the first underlay and corresponding to the display region; the encapsulation adhesive is disposed between the first substrate and the second substrate, and is located on a periphery side of the light emitting device layer.

In some embodiments of the present application, the second substrate further comprises color filter layer, the color filter layer is disposed on the side of the second underlay near the first substrate, and the color filter layer corresponds to the display region.

In some embodiments of the present application, the display panel further comprises liquid crystals, the liquid crystals are disposed between the first substrate and the second substrate, and the first substrate is an array substrate.

Advantages

The embodiment of the present application employs the second substrate to cover the first bonding portion of the first substrate located in non-display region, disposes the electrically connected second conductive pad and third conductive pad in second substrate, uses the first conductive pads of the first substrate bonded to the second conductive pad, and uses the fourth conductive pad of the flexible circuit substrate bonded to the third conductive pad to further achieve the full screen.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

Figure 1:
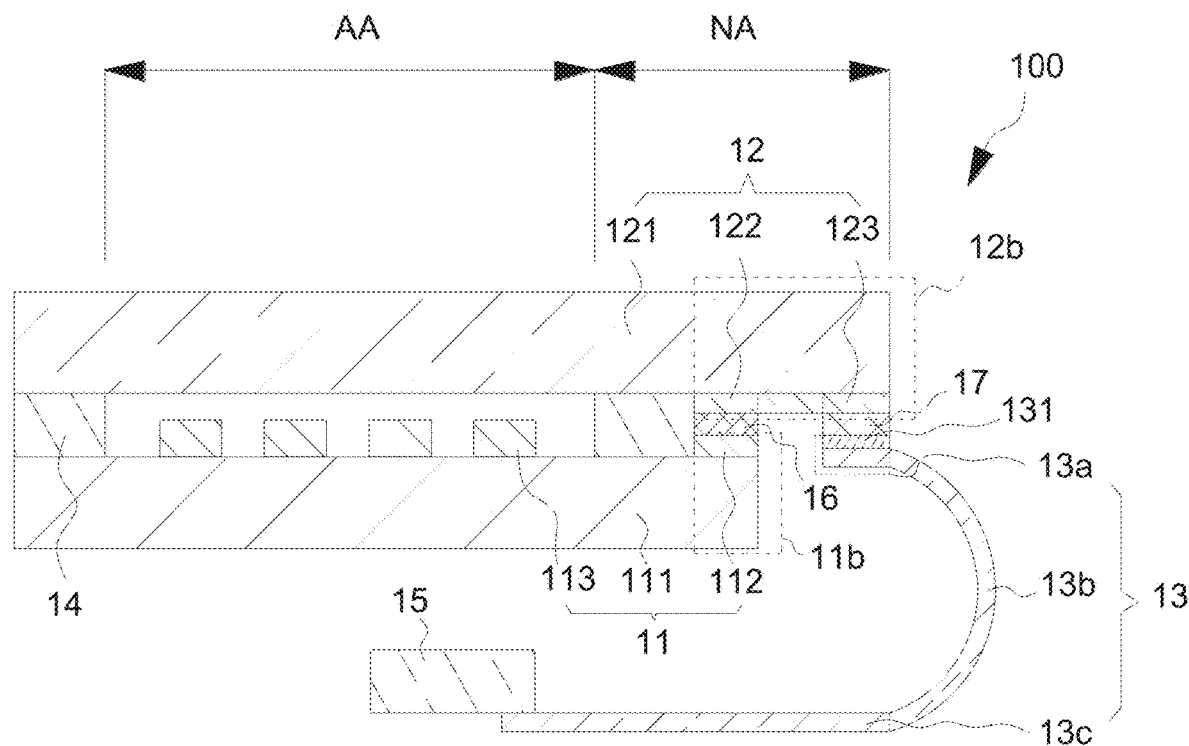
FIG. 1 is a schematic structural view of a display panel provided by a first embodiment of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

The embodiment of the present application provides a display panel, which will be described in detail as follows. It should be explained that the order of descriptions in the following embodiments is not to limit the preferred order of the embodiments.

With reference to FIG. 1, a first embodiment of the present application provides a display panel 100 comprising a display region AA and a non-display region NA disposed on a side of the display region AA. The display panel 100 comprises a first substrate 11, a second substrate 12, a flexible circuit substrate 13, an encapsulation adhesive 14, and a printed circuit board 15.

The first substrate 11 comprises a first main body portion and a first bonding portion 11b. The first main body portion is connected to the first bonding portion 11b. The first main body portion corresponds to the display region AA. The first bonding portion 11b corresponds to the non-display region NA.

The second substrate 12 is disposed opposite to the first substrate 11. The second substrate 12 is located on a light exiting side of the display panel 100. The second substrate 12 comprises a second main body portion and a second bonding portion 12b. The second bonding portion 12b covers the first bonding portion 11b. An end of the second bonding portion 12b is bonded and connected to the first bonding portion 11b.

The flexible circuit substrate 13 is bonded and connected to another end of the second bonding portion 12b.

The encapsulation adhesive 14 is disposed between the first substrate 11 and the second substrate 12 to attach the first substrate 11 and the second substrate 12 together.

The printed circuit board 15 is bonded and connected to the flexible circuit substrate 13. The printed circuit board 15 is disposed on a side of the first substrate 11 away from second substrate 12.

With reference to FIG. 1, a first length is defined from an end of the first substrate 11 on the first bonding portion 11b to an end of the first substrate 11 away from first bonding portion 11b. A second length is defined from an end of the second substrate 12 on the second bonding portion 12b to an end of the second substrate 12 away from second bonding portion 12b. The first length is less than the second length.

The first embodiment, because the second length of the second substrate 12 is greater than the first length of the first substrate 11, makes the second substrate 12 cover the first bonding portion 11b of the first substrate 11 in the non-display region NA. An end of the second bonding portion 12b is bonded to the first bonding portion 11b, and another end of the second bonding portion 12b is bonded to the flexible circuit substrate 13 to further achieve the full screen.

Specifically, because the second substrate 12 is utilized to cover the first bonding portion of the first substrate 11 in the non-display region NA, an orthographic projection of the first bonding portion 11b on a plane on which the display panel 100 is located within an orthographic projection of the second bonding portion 12b on the plane on which the display panel 100 is located. Thus, in later fabrication processes, a front frame for covering the bonding region can be saved to achieve the full screen.

Optionally, flexible circuit substrate 13 can be a chip on film, and can be a flexible circuit board.

In some embodiments, the printed circuit board 15 can also be saved.

Specifically, the first substrate 11 comprises a first underlay 111, a plurality of first conductive pads 112, and a light emitting device layer 113. The first conductive pads 112 are disposed on the first underlay 111, and corresponds to the non-display region NA. The light emitting device layer 113 is disposed on the first underlay 111, and corresponds to the display region AA. The encapsulation adhesive 14 is located on the periphery side of the light emitting device layer 113.

Figure 2:
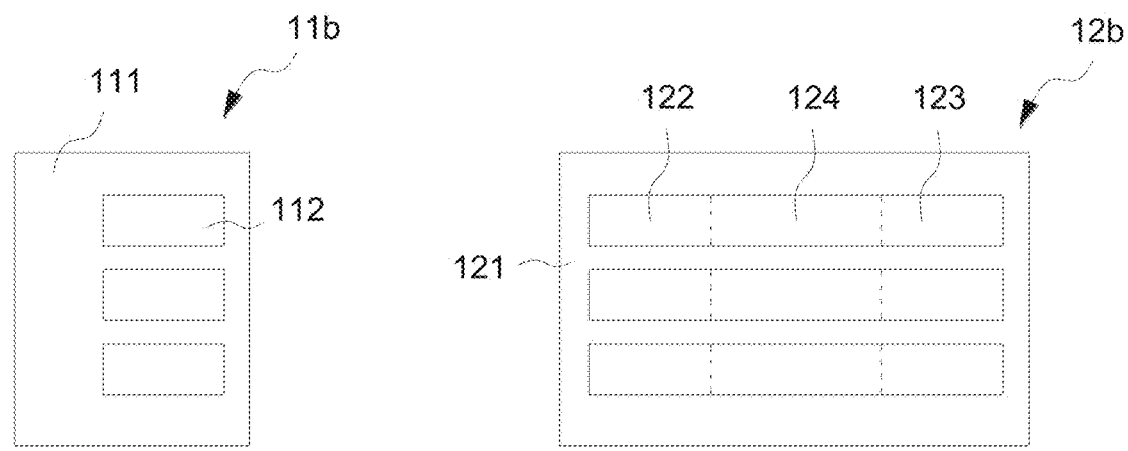
FIG. 2 is a schematic plane view of a first bonding portion and a second bonding portion of the display panel provided by the first embodiment of the present application.

A portion of the first substrate 11 corresponding to the display region AA serves as a first main body portion. A portion of the first substrate 11 corresponding to non-display region NA serves as a first bonding portion 11b. Namely, the first bonding portion 11b comprises a portion of the first underlay 111 and the first conductive pads 112, and the first conductive pads 112 are disposed on the first underlay 111, as shown in FIG. 2.

Optionally, material of the first underlay 111 can be glass, sapphire, quartz, or silicon. In some embodiments, material of the first underlay 111 can also be polyimide, silicon nitride, or silicon oxide.

Optionally, material of the first conductive pads 112 can be oxide such as indium tin oxide, indium zinc oxide, etc. The material also can be metal, alloy, compound, and mixture thereof with various conductive characteristics, for example, gold, silver, or platinum can be used.

Optionally, the light emitting device layer 113 can be an organic light emitting diode (OLED) light emitting device, an inorganic light emitting diode light emitting device, or a quantum dot light emitting diode (QLED) light emitting device. The inorganic light emitting diode light emitting device can be a micro light emitting diode (micro-LED) and a mini light emitting diode (mini-LED).

The second substrate 12 comprises a second underlay 121, a second conductive pad 122, and a third conductive pad 123. The second conductive pad 122 is disposed on a side of the second underlay 121 near the first substrate 11. The third conductive pad 123 is disposed on the side of the second underlay 121 near the first substrate 11. The second conductive pad 122 is electrically connected to the third conductive pad 123. The second conductive pad 122 is disposed opposite to the first conductive pads 112.

A portion of the second substrate 12 corresponding to the display region AA serves as a second main body portion. A portion of the second substrate 12 corresponding to the non-display region NA serves as a second bonding portion 12b. Namely, the second bonding portion 12b comprises a portion of the second underlay 121, and the second conductive pad 122, the third conductive pad 123, the second conductive pad 122, and the third conductive pad 123 are disposed on the first underlay 111.

The second conductive pad 122 is bonded and connected to the first conductive pads 112.

Optionally, material of the second underlay 121 can be material such as glass, sapphire, quartz, or silicon.

Optionally, material of the second conductive pad 122 and the third conductive pad 123 can be oxide such as indium tin oxide, indium zinc oxide, etc. The material also can be metal, alloy, compound, and mixture thereof with various conductive characteristics, for example, gold, silver, or platinum can be used.

With reference to FIG. 2, each second conductive pad 122 is electrically connected to one third conductive pad 123 correspondingly. Specifically, each second conductive pad 122 is connected to a third conductive pad 123 through a connection line 124.

Optionally, the second conductive pad 122 and the third conductive pad 123 are formed integrally to simplify the process and improve electrical stability the second conductive pad 122 and the third conductive pad 123.

In some embodiments, material of the second conductive pad 122, the connection line 124, and the third conductive pad 123 can also be different, and the three can be connected.

The flexible circuit substrate 13 comprises a first portion 13a including a fourth conductive pad 131. The fourth conductive pad 131 is bonded and connected to the third conductive pad 123. A portion of the flexible circuit substrate 13 away from fourth conductive pad 131 is disposed on a side of the first substrate 11 away from the second substrate 12.

Optionally, material of the fourth conductive pad 131 can be oxide such as indium tin oxide, indium zinc oxide, etc. The material also can be metal, alloy, compound, and mixture thereof with various conductive characteristics, for example, gold, silver, or platinum can be used.

In the first embodiment, the display panel 100 further comprises a first conductive adhesive 16 and a second conductive adhesive 17. The first conductive adhesive 16 is disposed between the first conductive pads 112 and the second conductive pad 122 to bond the first conductive pads 112 and the second conductive pad 122.

Optionally, the first conductive adhesive 16 comprises colloid and conductive particles doped in the colloid. Both the colloid and the encapsulation adhesive 14 are light curing adhesive, and the encapsulation adhesive 14 and the first conductive adhesive 16 can be exposed to light at one time during the process to complete curing thereof to improve a process efficiency.

Optionally, the colloid and the encapsulation adhesive 14 can be ultraviolet curing adhesive.

In some embodiments, the colloid and the encapsulation adhesive 14 can also be different material, for example, the encapsulation adhesive 14 is a light curing adhesive, while the colloid is a thermal curing adhesive.

The second conductive adhesive 17 is disposed between the third conductive pad 123 and the fourth conductive pad 131 to bond the third conductive pad 123 and the fourth conductive pad 131.

In the first embodiment, the third conductive pad 123 is disposed on the side of the second underlay 121 near the first substrate 11. Namely, the second conductive pad 122 and the third conductive pad 123 are disposed on the same side of the second underlay 121. Because the length of the second substrate 12 is greater than the length of the first substrate 11 and the width of the second bonding portion 12b is greater than the width of the first bonding portion 11b, the second underlay 121 can cover the first portion 13a of the flexible circuit substrate 13.

In the first embodiment, the flexible circuit substrate 13 comprises a second portion 13b connected to the first portion 13a and a third portion 13c connected to the second portion 13b. Along a vertical direction, the second portion 13b is located outside the second substrate 12, and the third portion 13c is disposed on a side of the first substrate 11 away from second substrate 12.

Namely, the first portion 13a and the second portion 13b are suspended, and the second portion 13b is bent. Compared to the prior art, because the end of the second portion 13b is not squeezed by the substrate, stress applied to the end of the second portion 13a is reduced, which decreases a bending distance of the second portion 13a to further reduce the frame.

The printed circuit board 15 is bonded and connected to the third portion 13c.

Figure 3:
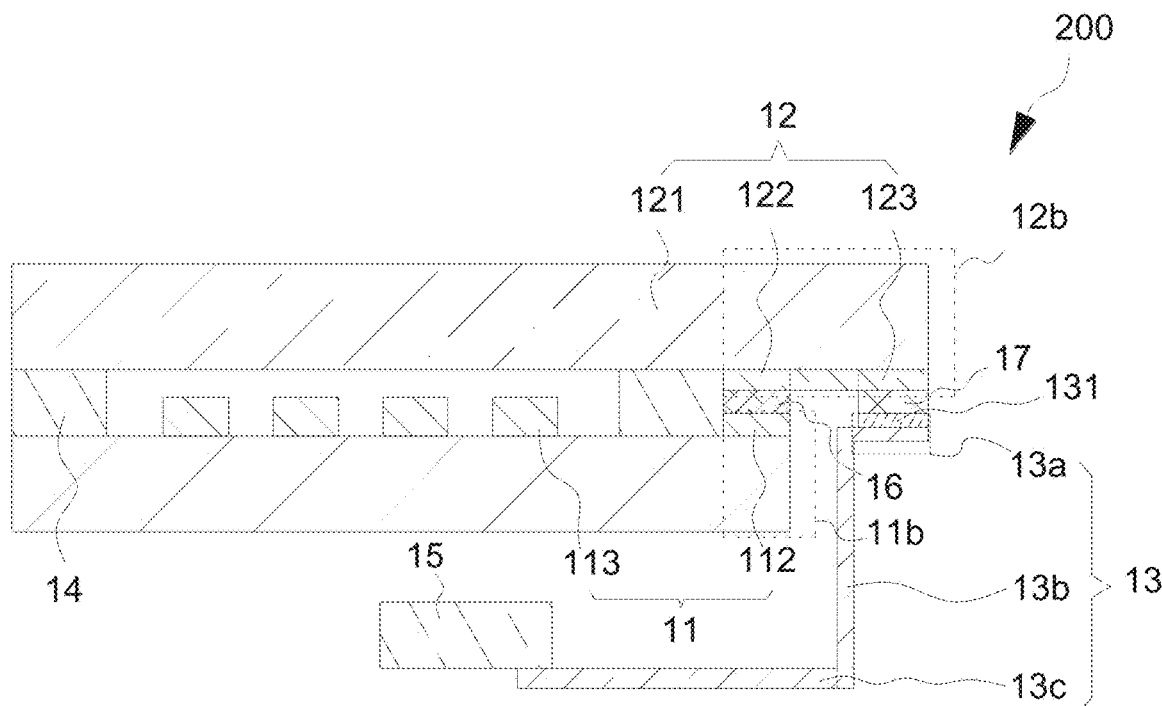
FIG. 3 is a schematic structural view of a display panel provided by a second embodiment of the present application.

With reference to FIG. 3, on the basis of the display panel 100 of the first embodiment, a difference of a display panel 200 of the second embodiment from the display panel 100 of the first embodiment is that:

The second substrate 12 covers the flexible circuit substrate 13.

The flexible circuit substrate 13 comprises a second portion 13b connected to the first portion 13a and a third portion 13c connected to the second portion 13b. The second portion 13b is located on a side of the first substrate 11. An orthographic projection of the second portion 13b on a plane on which the second substrate 12 is located is located in the second substrate 12. The third portion 13c is disposed on a side of the first substrate 11 away from the second substrate 12.

Compared to the display panel 100 of the first embodiment, the display panel 200 of the second embodiment, by changing a way of extension of the flexible circuit substrate 13, makes the second substrate 12 cover the entire flexible circuit substrate 13 to achieve an effect of further reducing the frame.

Figure 4:
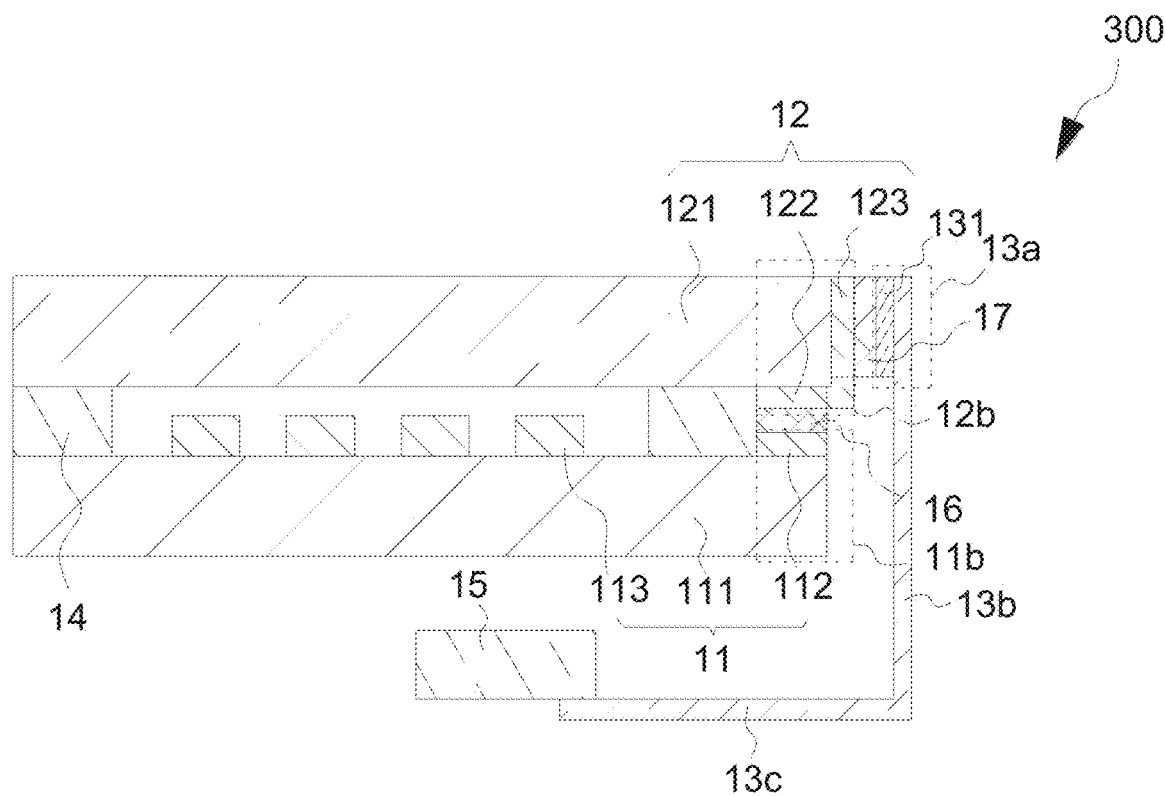
FIG. 4 is a schematic structural view of a display panel provided by a third embodiment of the present application.

With reference to FIG. 4, on the basis of the second embodiment, a difference of a display panel 300 of the third embodiment from the display panel 200 of the second embodiment is that:

The third conductive pad 123 is disposed on a side surface of the second underlay 121. An extension direction of the second conductive pad 122 intersects an extension direction of the third conductive pad 123.

The third embodiment, because of the third conductive pad 123 disposed on the side surface of the second underlay 121, further reduces a width of the second bonding portion 12b to reduce the frame compared to the second embodiment.

Figure 5:
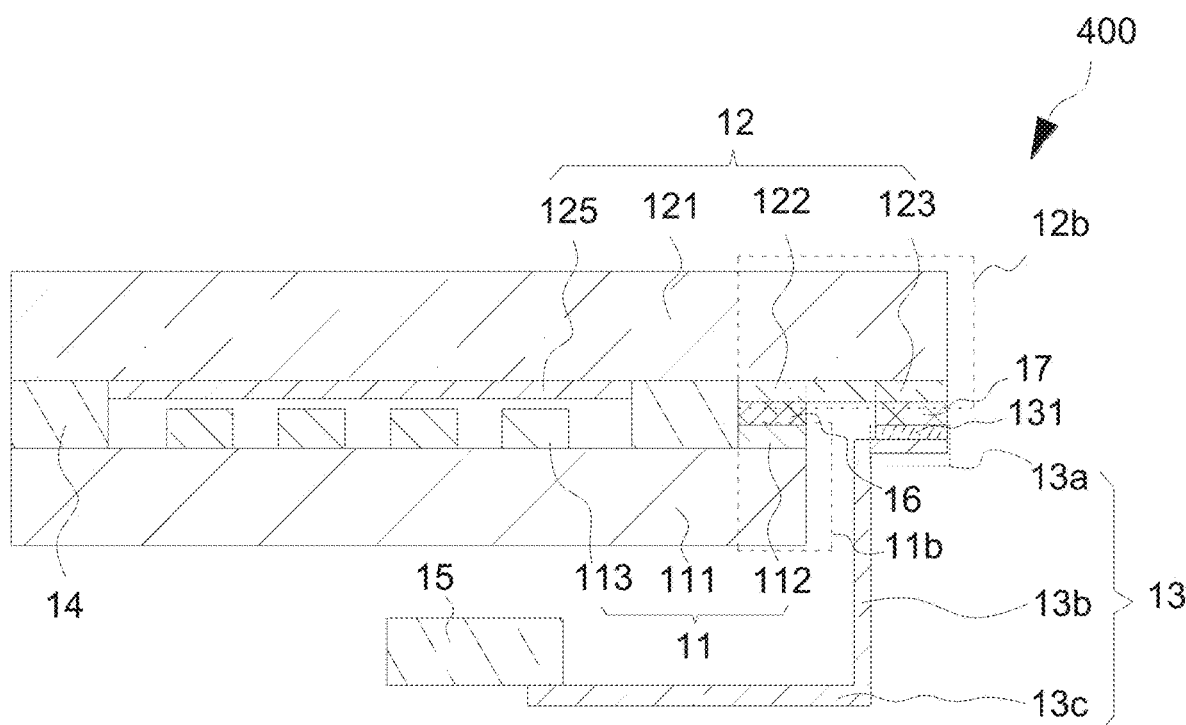
FIG. 5 is a schematic structural view of a display panel provided by a fourth embodiment of the present application.

With reference to FIG. 5, on the basis of the display panel 100, 200, 300 of the first to third embodiments, in a display panel 400 of the fourth embodiment, the second substrate 12 further comprises a color filter layer 125, and the color filter layer 125 is disposed on the side of the second underlay 121 near the first substrate 11. The color filter layer 125 corresponds to the display region AA.

The display panel 400 of the fourth embodiment is described based on the second embodiment, but is not limited thereto.

Figure 6:
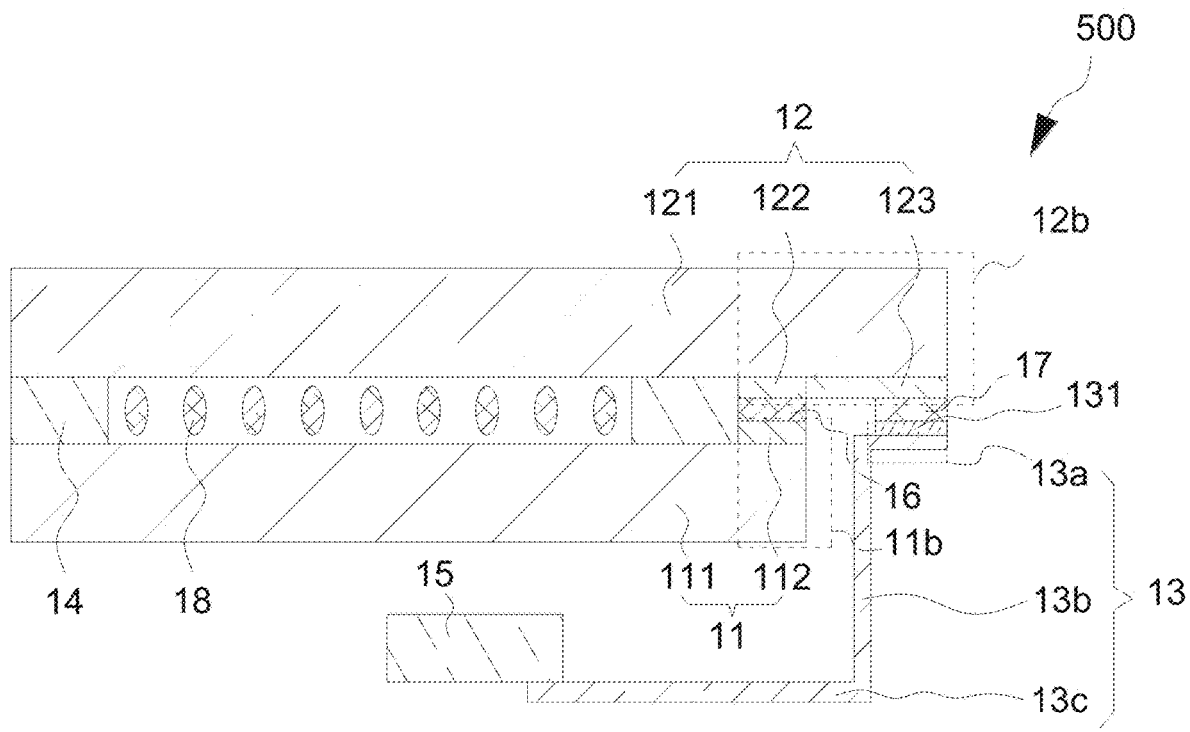
FIG. 6 is a schematic structural view of a display panel provided by a fifth embodiment of the present application.

With reference to FIG. 6, on the basis of any one embodiment of the display panel 100, 200, 300 of first to third embodiments, a difference of a display panel 500 of the fifth embodiment therefrom is that: The display panel 500 further comprises liquid crystals 18. The liquid crystals 18 are disposed between the first substrate 11 and the second substrate 12. The first substrate 11 is an array substrate, and the second substrate 12 is a color filter substrate.

In the display panel 500, bonding structures and disposing manners of the first bonding portion 11b, the second bonding portion 12b, and the flexible circuit substrate 13 are the same as those in any one of the first to third embodiments.

The display panel 500 of the fifth embodiment is described based on the second embodiment, but is not limited thereto.

The first to fifth embodiments of the present application all employ the second substrate 12 to cover the first bonding portion 11b of the first substrate 11 located in the non-display region NA, dispose the second conductive pad 122 and the third conductive pad 123 electrically connected in the second substrate 12, use the first conductive pads 112 of the first substrate 11 bonded and connected to the second conductive pad 122, and use the flexible circuit substrate 13 bonded and connected to the third conductive pad 123 to achieve the full screen effect.

A display panel provided by the embodiment of the present application is described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. A display panel, comprising a display region and a non-display region disposed on a side of the display region, wherein the display panel comprises:
a first substrate, wherein the first substrate comprises a first bonding portion, and the first bonding portion corresponds to the non-display region;
a second substrate, wherein the second substrate and the first substrate are disposed opposite to each other, the second substrate is located on a light exiting side of the display panel, the second substrate comprises a second bonding portion, the second bonding portion covers the first bonding portion, and an end of the second bonding portion is bonded and connected to the first bonding portion; and
a flexible circuit substrate, wherein the flexible circuit substrate is bonded and connected to another end of the second bonding portion, and the flexible circuit substrate is a chip on film or a flexible circuit board;
wherein the first bonding portion comprises a first underlay and a plurality of first conductive pads, and the first conductive pads are disposed on the first underlay; and
wherein the second bonding portion comprises a second underlay and a second conductive pad, the second conductive pad is disposed on a side of the second underlay facing the first substrate, the second conductive pad and the first conductive pads are disposed opposite to each other, and the second conductive pad is bonded and connected to the first conductive pads;
wherein the second bonding portion comprises a third conductive pad, the third conductive pad is disposed on the second underlay, and the second conductive pad is electrically connected to the third conductive pad;
the flexible circuit substrate comprises a first portion including a fourth conductive pad, the fourth conductive pad is bonded and connected to the third conductive pad, and a portion of the flexible circuit substrate away from the fourth conductive pad is disposed on a side of the first substrate away from the second substrate;
wherein the third conductive pad is perpendicular to the second conductive pad and is disposed on a side surface of the second underlay being an outward facing side surface and perpendicular to the side of the second underlay.

2. The display panel according to claim 1, wherein a first length is defined from an end of the first substrate on the first bonding portion to an end of the first substrate away from the first bonding portion; a second length is defined from an end of the second substrate on the second bonding portion to an end of the second substrate away from the second bonding portion; and the first length is less than the second length.

3. The display panel according to claim 1, wherein the flexible circuit substrate comprises a second portion connected to the first portion and a third portion connected to the second portion; and along a vertical direction, the second portion is located on an outside of the second substrate, and the third portion is disposed on the side of the first substrate away from the second substrate.

4. A display panel, comprising a display region and a non-display region disposed on a side of the display region, wherein the display panel comprises:
a first substrate, wherein the first substrate comprises a first bonding portion, and the first bonding portion corresponds to the non-display region;
a second substrate, wherein the second substrate and the first substrate are disposed opposite to each other, the second substrate is located on a light exiting side of the display panel, the second substrate comprises a second bonding portion, the second bonding portion covers the first bonding portion, and an end of the second bonding portion is bonded and connected to the first bonding portion; and
a flexible circuit substrate, wherein the flexible circuit substrate is bonded and connected to another end of the second bonding portion;
wherein the first bonding portion comprises a first underlay and a plurality of first conductive pads, and the first conductive pads are disposed on the first underlay;
the second bonding portion comprises a second underlay, a second conductive pad, and a third conductive pad, the second conductive pad is disposed on a side of the second underlay facing the first substrate, the third conductive pad is disposed on the second underlay, the second conductive pad is electrically connected to the third conductive pad, the second conductive pad is disposed opposite to the first conductive pads, and the second conductive pad is bonded and connected to the first conductive pads; and
the flexible circuit substrate comprises a first portion including a fourth conductive pad, the fourth conductive pad is bonded and connected to the third conductive pad, and a portion of the flexible circuit substrate away from the fourth conductive pad is disposed on a side of the first substrate away from the second substrate;
wherein the third conductive pad is perpendicular to the second conductive pad and is disposed on a side surface of the second underlay being an outward facing side surface and perpendicular to the side of the second underlay.

5. The display panel according to claim 4, wherein a first length is defined from an end of the first substrate on the first bonding portion to an end of the first substrate away from the first bonding portion; a second length is defined from an end of the second substrate on the second bonding portion to an end of the second substrate away from the second bonding portion; and the first length is less than the second length.

6. The display panel according to claim 4, wherein the flexible circuit substrate comprises a second portion connected to the first portion and a third portion connected to the second portion; and along a vertical direction, the second portion is located on an outside of the second substrate, and the third portion is disposed on the side of the first substrate away from the second substrate.

7. The display panel according to claim 6, wherein the display panel further comprises a printed circuit board, the printed circuit board is bonded and connected to the third portion, and the printed circuit board is disposed on the side of the first substrate away from the second substrate.

8. The display panel according to claim 4, wherein each second conductive pad is electrically connected to the third conductive pad correspondingly, and the second conductive pad and the third conductive pad are formed integrally.

9. The display panel according to claim 4, wherein the display panel further comprises an encapsulation adhesive, the first substrate further comprises a light emitting device layer disposed on the first underlay and corresponding to the display region; and the encapsulation adhesive is disposed between the first substrate and the second substrate, and is located on a periphery side of the light emitting device layer.

10. The display panel according to claim 9, wherein the second substrate further comprises a color filter layer, the color filter layer is disposed on the side of the second underlay near the first substrate, and the color filter layer corresponds to the display region.

11. The display panel according to claim 4, wherein the display panel further comprises liquid crystals, the liquid crystals are disposed between the first substrate and the second substrate, and the first substrate is an array substrate.

* * * * *